United States Patent
Tsao et al.

(10) Patent No.: US 8,653,607 B2
(45) Date of Patent: Feb. 18, 2014

(54) METHOD FOR 1/F NOISE REDUCTION IN NMOS DEVICES

(75) Inventors: Alwin James Tsao, Garland, TX (US); Purushothaman Srinivasan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/523,349

(22) Filed: Jun. 14, 2012

(65) Prior Publication Data

US 2012/0319210 A1    Dec. 20, 2012

Related U.S. Application Data

(60) Provisional application No. 61/498,225, filed on Jun. 17, 2011.

(51) Int. Cl.
*H01L 27/088*   (2006.01)
*H01L 21/8234*   (2006.01)

(52) U.S. Cl.
USPC .............. 257/392; 257/E27.06; 257/E21.618; 438/278

(58) Field of Classification Search
None
See application file for complete search history.

(56) References Cited

U.S. PATENT DOCUMENTS 7,018,880 B2    3/2006  Hao et al.
7,163,878 B2 *  1/2007  Kohli et al. .................. 438/520

OTHER PUBLICATIONS

"The Effects of Fluorine on Parametrics and Reliability in a 0.18- m 3.5/6.8 nm Dual Gate Oxide CMOS Technology", Authors: T. B. Hook, E. Adler, F. Guarin, J. Lukaitis, N. Rovedo, and K. Schruefer; IEEE Transactions on Electron Devices, vol. 48, No. 7, Jul. 2001, pp. 1346-1353.
"Pocket Implantation Effect on Drain Current Flicker Noise in Analog nMOSFET Devices", Jun-Wei Wu, C. Cheng, K.Chiu, J. Guo, W. Lien, C. Chang, G.Huang, and T. Wang, IEEE Transactions on Electron Devices, vol. 51, No. 8, Aug. 2004, pp. 1262-1266.

* cited by examiner

*Primary Examiner* — Seahvosh Nikmanesh
(74) *Attorney, Agent, or Firm* — Jacqueline J. Garner; Wade J. Brady, III; Frederick J. Telecky, Jr.

(57) ABSTRACT

An integrated circuit, in which a minimum gate length of low-noise NMOS transistors is less than twice a minimum gate length of logic NMOS transistors, is formed by: forming gates of the low-noise NMOS transistors concurrently with gates of the logic NMOS transistors, forming a low-noise NMDD implant mask which exposes the low-noise NMOS transistors and covers the logic NMOS transistors and logic PMOS transistors, ion implanting n-type NMDD dopants and fluorine into the low-noise NMOS transistors and limiting p-type halo dopants to less than 20 percent of a corresponding logic NMOS halo dose, removing the low-noise NMDD implant mask, forming a logic NMDD implant mask which exposes the logic NMOS transistors and covers the low-noise NMOS transistors and logic PMOS transistors, ion implanting n-type NMDD dopants and p-type halo dopants, but not implanting fluorine, into the logic NMOS transistors, and removing the logic NMDD implant mask.

12 Claims, 13 Drawing Sheets

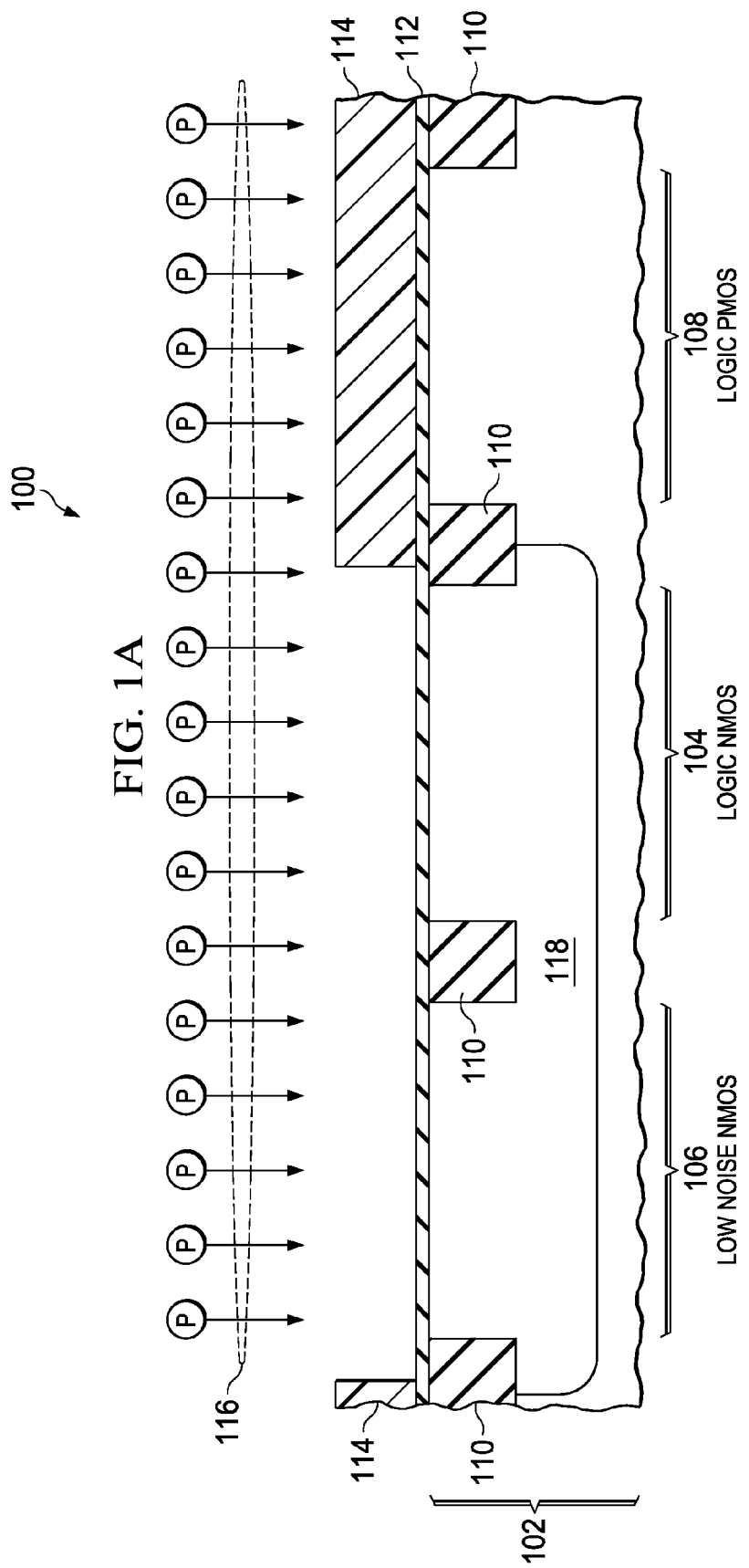

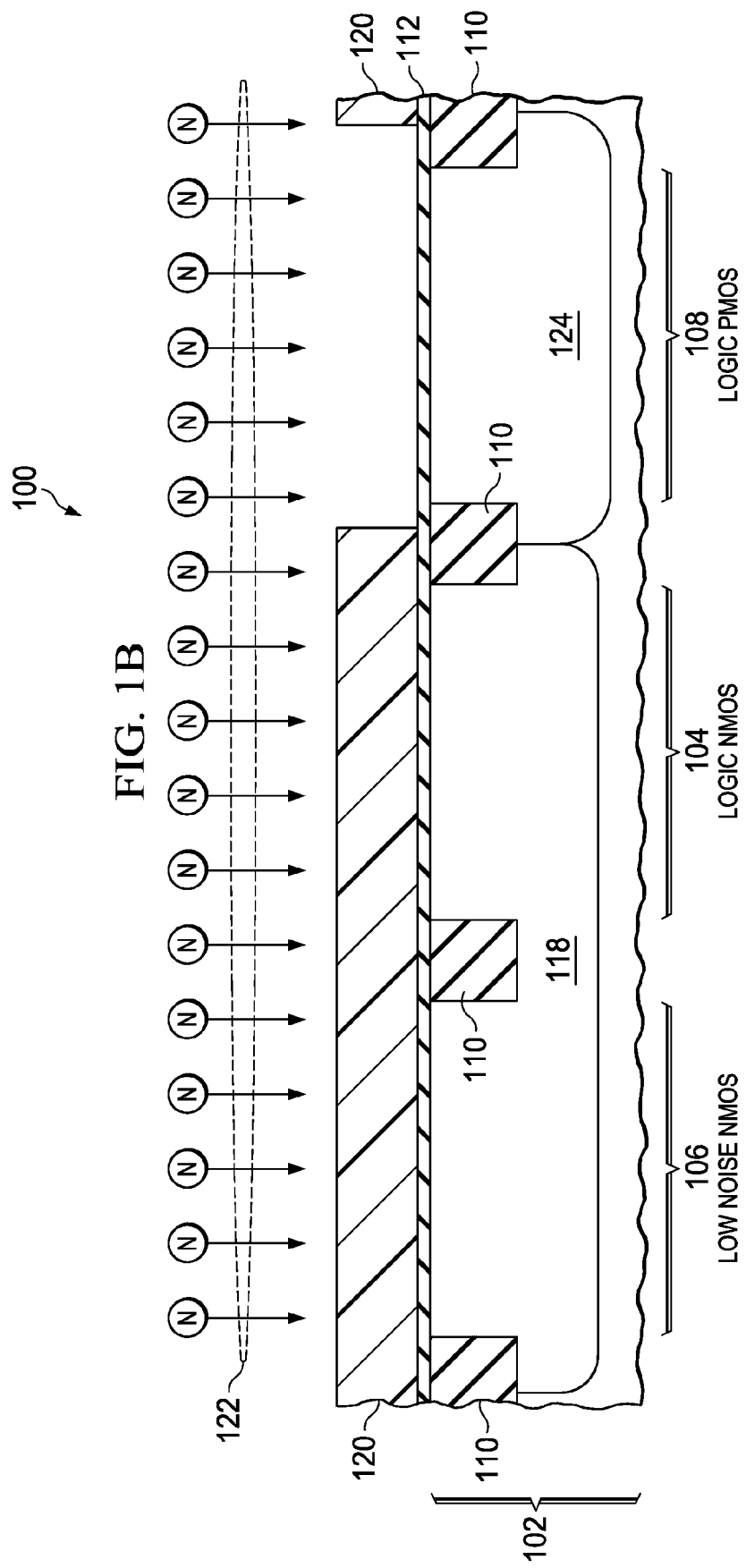

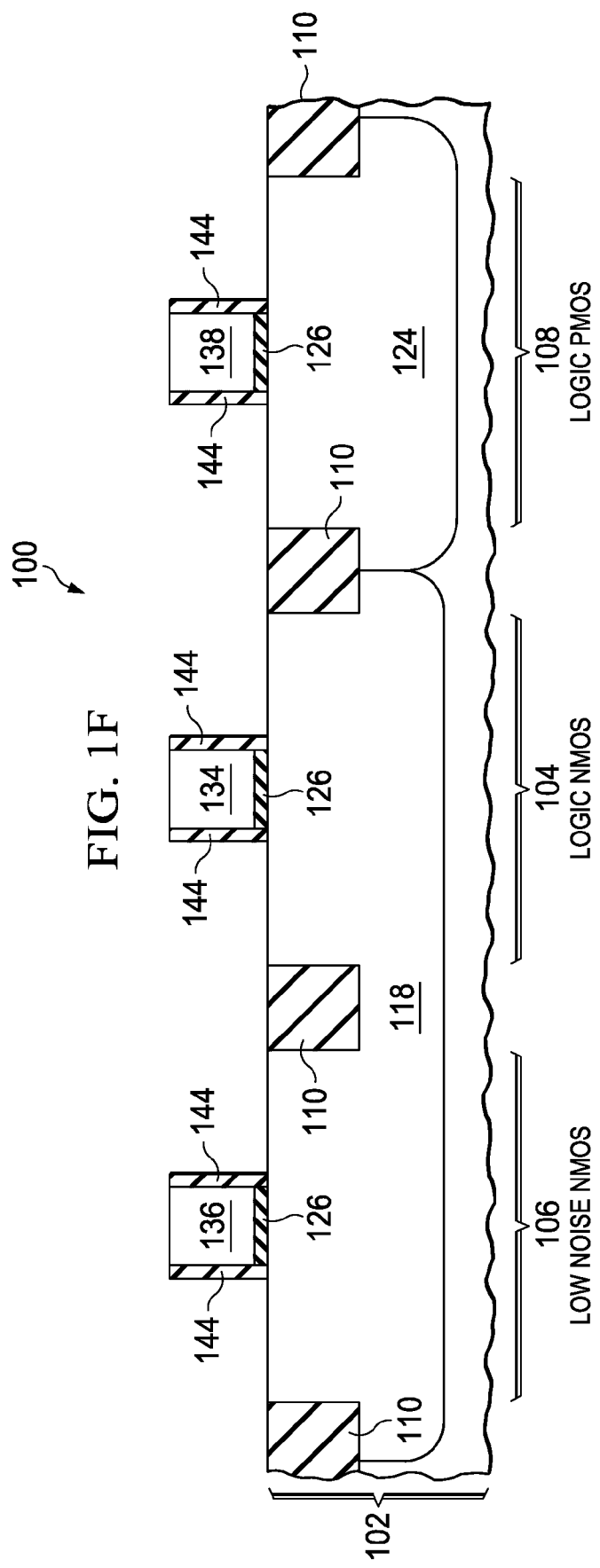

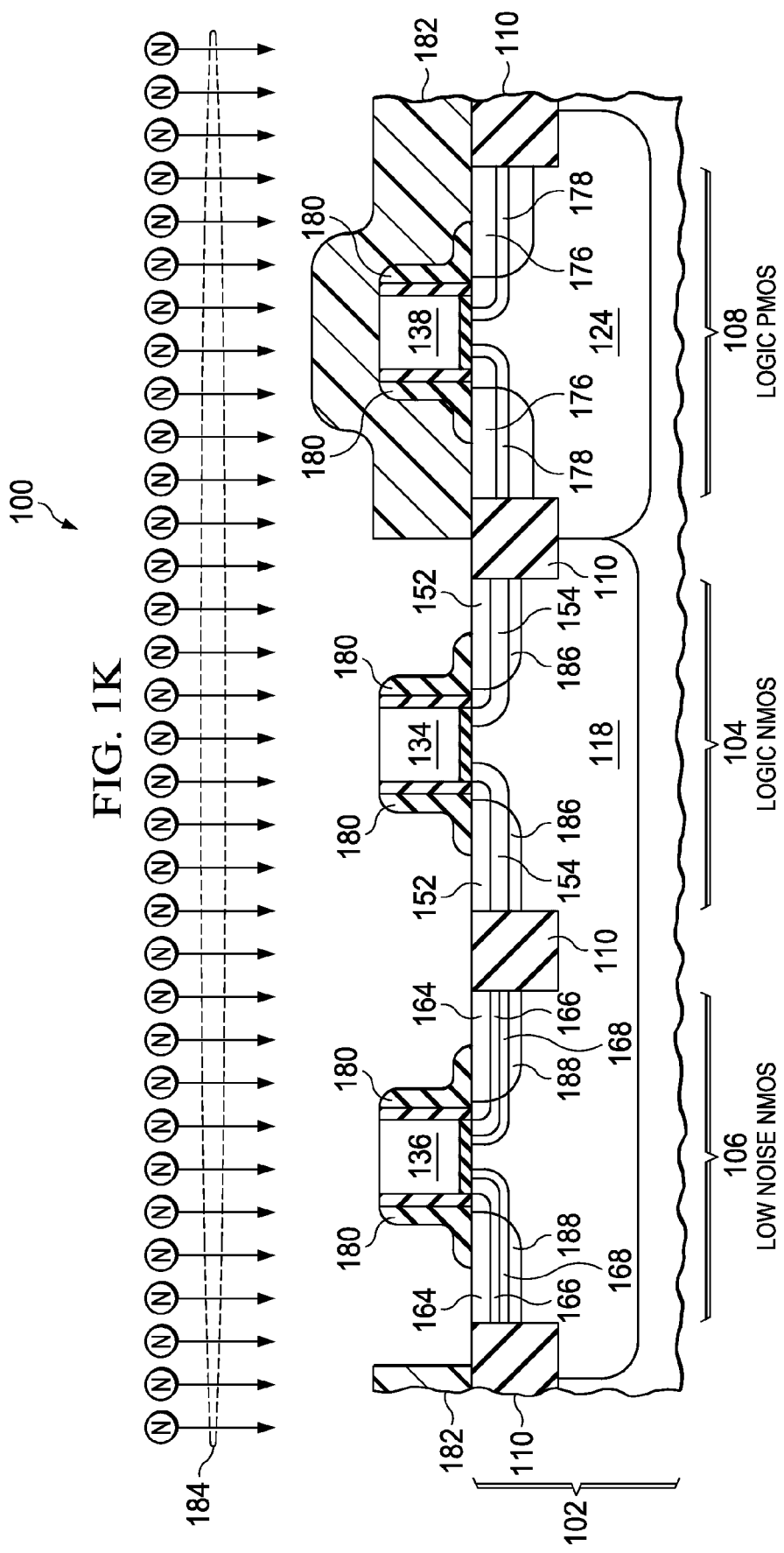

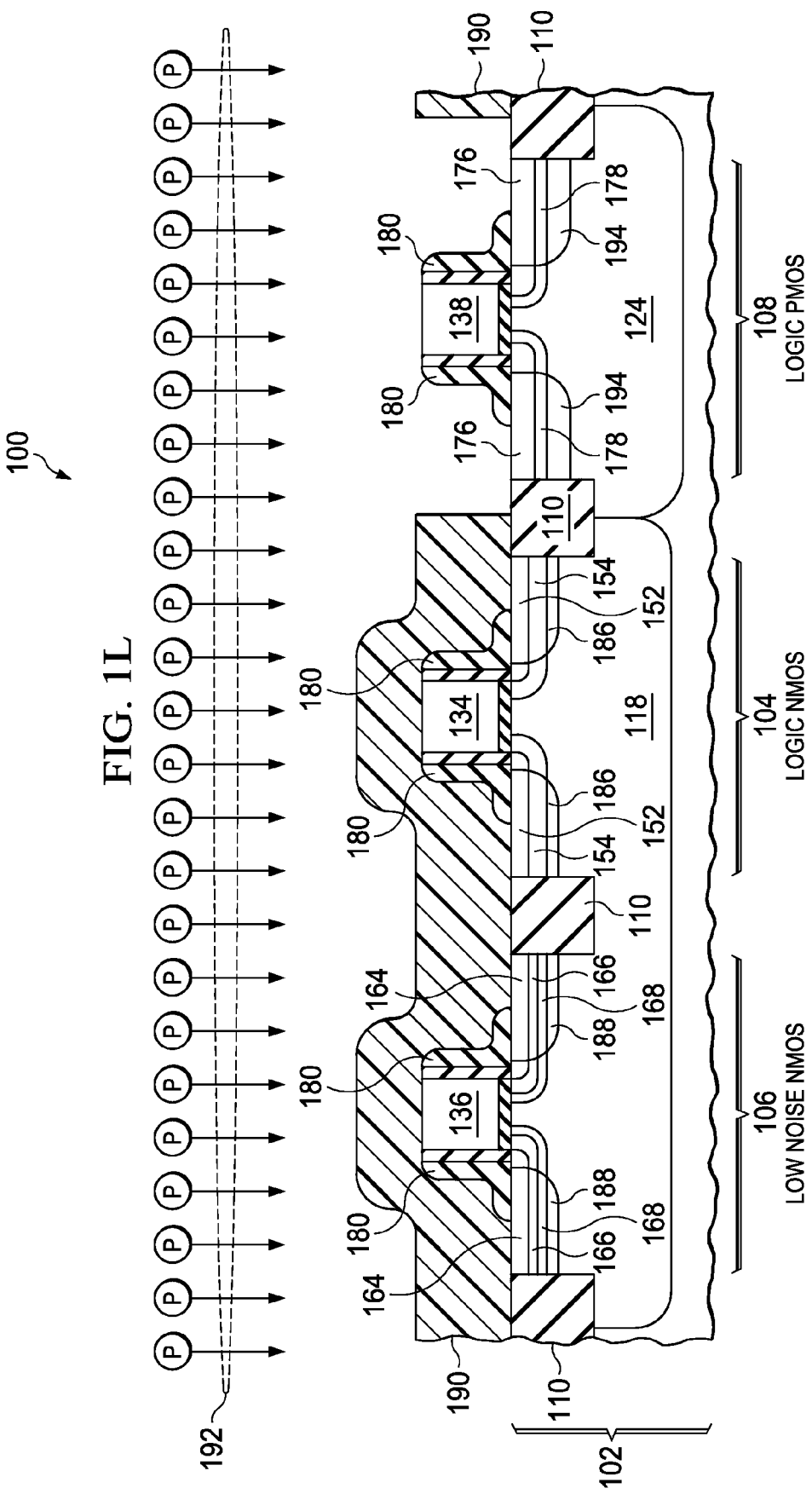

METHOD FOR 1/F NOISE REDUCTION IN NMOS DEVICES

CROSS-REFERENCE TO RELATED APPLICATIONS

This application claims the benefit of priority under U.S.C. §119(e) of U.S. Provisional Application 61/498,225, filed Jun. 17, 2011.

FIELD OF THE INVENTION

This invention relates to the field of integrated circuits. More particularly, this invention relates to MOS transistors in integrated circuits.

BACKGROUND OF THE INVENTION

An integrated circuit may include logic circuits containing n-channel metal oxide semiconductor (NMOS) transistors and p-channel metal oxide semiconductor (PMOS) transistors. Logic circuits are characterized by circuit elements such as NAND gates, NOR gates and/or binary adders. Some logic circuits are used as input/output circuits for digital signals transmitted into and out of the integrated circuit. Input/output circuits may operate at higher voltages than core logic circuits in the integrated circuit. The integrated circuit may further include analog circuits containing NMOS transistors in circuit elements such as oscillators. It may be desired to operate the analog circuit at high frequencies, which may require a gate length of the NMOS transistors in the analog circuit elements to have gate lengths comparable to gate lengths of the NMOS transistors in the logic circuits. It may also be desired to operate the analog circuit at a low noise level. It may further be desired to fabricate the integrated circuit within a target cost. Attaining these three goals may be problematic, in that high speed NMOS transistors formed using logic fabrication processes frequently exhibit undesirable noise levels.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit including logic NMOS transistors, logic PMOS transistors and low-noise NMOS transistors, in which a minimum gate length of the low-noise NMOS transistors is less than four times a minimum gate length of the logic NMOS transistors, may be formed by a process sequence including the steps of: forming gates of the low-noise NMOS transistors concurrently with gates of the logic NMOS transistors, forming a logic NMDD implant mask which exposes the logic NMOS transistors and covers the low-noise NMOS transistors and logic PMOS transistors, ion implanting n-type NMDD dopants and p-type halo dopants, but not implanting fluorine, into the logic NMOS transistors, removing the logic NMDD implant mask, forming a low-noise n-channel medium doped drain (NMDD) implant mask which exposes the low-noise NMOS transistors and covers the logic NMOS transistors and logic PMOS transistors, ion implanting n-type NMDD dopants and fluorine, and p-type halo dopants at a total dose less than 20 percent of the logic NMOS halo dose, into the low-noise NMOS transistors, and removing the low-noise NMDD implant mask.

DESCRIPTION OF THE VIEWS OF THE DRAWING

FIG. 1A through FIG. 1M are cross sections of an integrated circuit including logic NMOS transistors, logic PMOS transistors and low-noise NMOS transistors, depicted in successive stages of fabrication.

DETAILED DESCRIPTION OF EXAMPLE EMBODIMENTS

An integrated circuit including logic NMOS transistors, logic PMOS transistors and low-noise NMOS transistors, in which a minimum gate length of the low-noise NMOS transistors is less than four times a minimum gate length of the logic NMOS transistors, may be formed by a process sequence including the steps of: forming gates of the low-noise NMOS transistors concurrently with gates of the logic NMOS transistors, forming a logic NMDD implant mask which exposes the logic NMOS transistors and covers the low-noise NMOS transistors and logic PMOS transistors, ion implanting n-type NMDD dopants and p-type halo dopants, but not implanting fluorine, into the logic NMOS transistors, and removing the logic NMDD implant mask, forming a low-noise n-channel medium doped drain (NMDD) implant mask which exposes the low-noise NMOS transistors and covers the logic NMOS transistors and logic PMOS transistors, ion implanting n-type NMDD dopants and fluorine, and implanting p-type halo dopants at a total dose less than 20 percent of the logic NMOS halo dose, into the low-noise NMOS transistors, and removing the low-noise NMDD implant mask. Implant masks used to form the integrated circuit, other than the low-noise NMDD implant mask and the logic NMDD implant mask, either expose the low-noise NMOS transistor concurrently with the logic NMOS transistor or cover the low-noise NMOS transistor concurrently with the logic NMOS transistor. Etch masks used to form the integrated circuit either expose the low-noise NMOS transistor concurrently with the logic NMOS transistor or cover the low-noise NMOS transistor concurrently with the logic NMOS transistor.

For the purposes of this description, the term "substantially equal" as applied to structural elements formed in an integrated circuit and process parameters used in forming an integrated circuit is understood to mean equal within fabrication tolerances used to fabricate the integrated circuit.

Figure 1C:
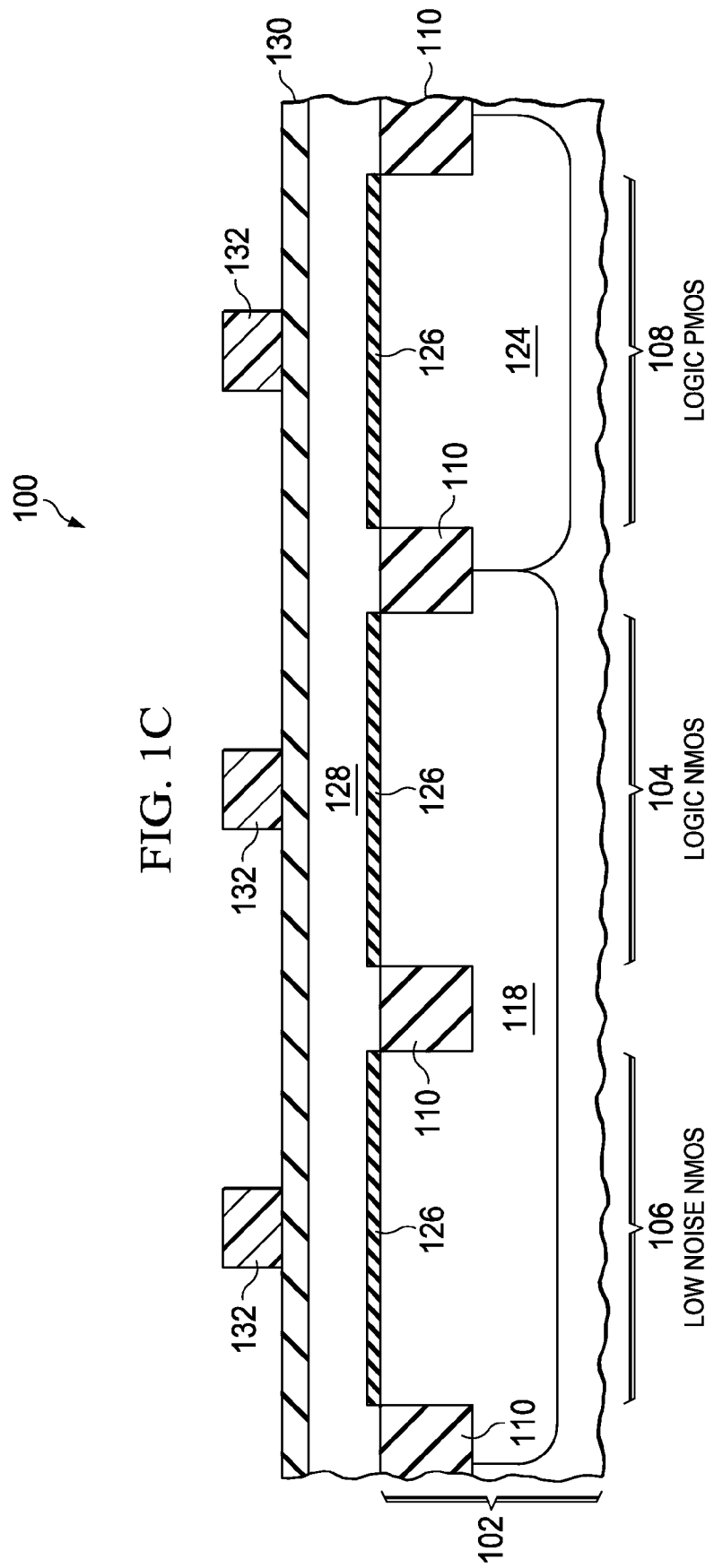

FIG. 1A through FIG. 1M are cross sections of an integrated circuit including logic NMOS transistors, logic PMOS transistors and low-noise NMOS transistors, depicted in successive stages of fabrication. Referring to FIG. 1A, the integrated circuit 100 is formed in and on a semiconductor substrate 102, which may be, for example, a single crystal silicon wafer, a silicon-on-insulator (SOI) substrate, a hybrid orientation technology (HOT) wafer with regions of different crystal orientations, or other material appropriate for fabrication of the integrated circuit 100. The integrated circuit 100 includes an area defined for an instance of the logic NMOS transistors 104, an area defined for an instance of the low-noise NMOS transistors 106 and an area defined for an instance of the logic PMOS transistors 108.

Elements of field oxide 110 may be formed at a top surface of the substrate 102, for example, of silicon dioxide between 250 and 600 nanometers thick. The field oxide 110 may be formed, for example, by shallow trench isolation (STI). An STI process may include the steps of: forming an oxide layer on the substrate 102, forming a silicon nitride layer on the oxide layer, patterning the silicon nitride layer so as to expose an area for the field oxide 110, etching a trench in the substrate 102 in the exposed area to an appropriate depth for a desired thickness of the field oxide 110, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer.

A sacrificial layer of 5 to 20 nanometers of silicon dioxide 112 may be formed over the substrate 102 to provide a screen oxide for subsequent implant operations and to protect a top surface of the substrate 102. The sacrificial layer of silicon dioxide 112 may be formed, for example, by thermal oxidation of the substrate 102.

A p-type well implant mask 114 is formed over the substrate 102 so as to expose the logic NMOS 104 and the low-noise NMOS 106 areas and to cover the logic PMOS 108 area. The p-type well implant mask 114 may include, for example, photoresist at least 1 micron thick formed by a photolithographic operation. A p-type well implant operation 116 is performed which implants p-type dopants, for example boron, into the substrate in areas exposed by the p-type well implant mask 114 at an exemplary dose of $1\times10^{12}$ cm$^{-2}$ to $1\times10^{14}$ cm$^{-2}$ at an exemplary energy of 150 keV to 250 keV. The p-type well implant mask 114 is removed after the p-type well implant operation 116 is completed. A subsequent anneal activates and diffuses the implanted dopants to form a p-type well 118 in the logic NMOS 104 and the low-noise NMOS 106 areas. The anneal may include an RTP operation at 1050° C. for 30 seconds or equivalent anneal conditions, for example, 1100° C. for 10 seconds, or 1000° C. for 100 seconds.

Referring to FIG. 1B, an n-type well implant mask 120 is formed over the substrate 102 so as to expose the logic PMOS 108 area, and to cover the logic NMOS 104 and the low-noise NMOS 106 areas. The n-type well implant mask 120 may include, for example, photoresist at least 1.2 microns thick formed by a photolithographic operation. An n-type well implant operation 122 is performed which implants n-type dopants, for example phosphorus, into the substrate in areas exposed by the n-type well implant mask 120 at an exemplary dose of $1\times10^{12}$ cm$^{-2}$ to $1\times10^{14}$ cm$^{-2}$ at an exemplary energy of 250 keV to 450 keV. The n-type well implant mask 120 is removed after the n-type well implant operation 122 is completed. A subsequent anneal activates and diffuses the implanted dopants to form an n-type well 124 in the logic PMOS 108 area. The anneal may be similar to the p-type well anneal described in reference to FIG. 1A, and may be performed concurrently with the p-type well anneal.

Referring to FIG. 1C, the sacrificial silicon dioxide layer 112 of FIG. 1A and FIG. 1B is removed, for example by a dilute aqueous solution of hydrofluoric acid. A layer of gate dielectric 126 is formed at the top surface of the substrate 102 in the logic NMOS 104, the low-noise NMOS 106 and the logic PMOS 108 areas. The gate dielectric layer 126 may be, for example, one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer 126 may include nitrogen as a result of exposure to a nitrogen containing plasma or a nitrogen containing ambient gas at temperatures between 50 C and 800 C. The gate dielectric layer 126 may be, in one example, 1 to 4 nanometers thick for instances of the logic NMOS 104 and low-noise NMOS 106 transistors which operate at 1 to 1.5 volts. In another example, the gate dielectric layer 126 may be 4 to 7 nanometers thick for instances of the logic NMOS 104 and low-noise NMOS 106 transistors which operate at 1.5 to 2.5 volts. In a further example, the gate dielectric layer 126 may be 7 to 9 nanometers thick for instances of the logic NMOS 104 and low-noise NMOS 106 transistors which operate at 2.5 to 3.3 volts. The gate dielectric layer 126 may be formed by any of a variety of gate dielectric formation processes, for example thermal oxidation, plasma nitridation of an oxide layer, and/or dielectric material deposition by atomic layer deposition (ALD).

A layer of gate material 128 is formed over the gate dielectric layer 126. The gate material layer 128 may be, for example, 50 to 150 nanometers of polycrystalline silicon, commonly referred to as polysilicon, formed by thermally decomposing SiH4 gas inside a low-pressure reactor at a temperature between 580° C. to 650° C. An optional hard mask layer 130 may be formed over the gate material layer 128 to provide more control over gate linewidths in a subsequent gate etch operation. The hard mask layer 130 may be, for example, one or more layers of silicon dioxide, silicon nitride, silicon carbide, and/or amorphous carbon.

A gate etch mask 132 is formed over the gate material layer 128, and over the hard mask layer 130 if present, so as to cover areas defined for gates of the logic NMOS 104, the low-noise NMOS 106 and the logic PMOS 108 transistors. The gate etch mask 132 may be formed by patterning a photolithographic layer stack of a bottom anti-reflection coat (BARC) layer, a photoresist layer, and possibly a top anti-reflection coat, using a photolithographic operation.

Figure 1D:
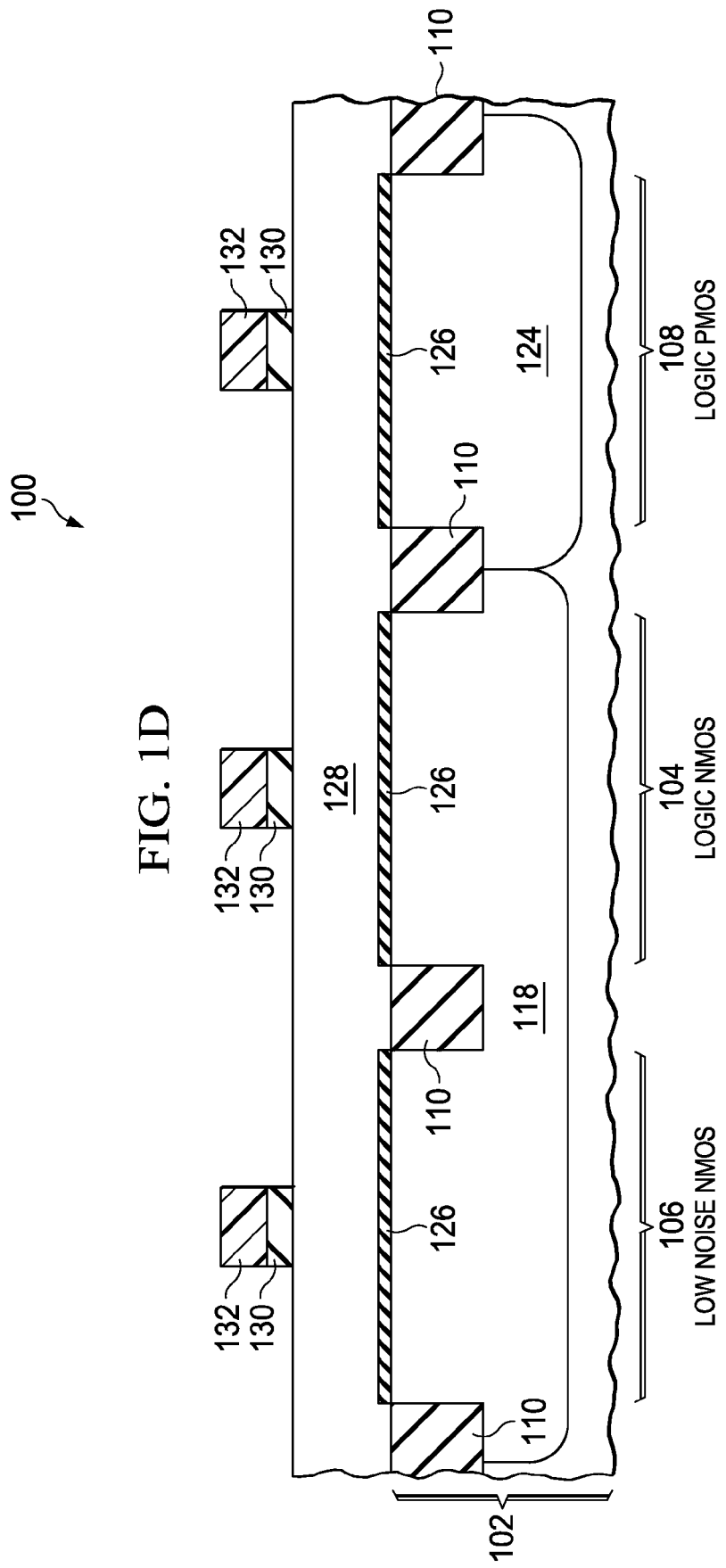

Referring to FIG. 1D, a first part of a gate etch operation is performed which removes the hard mask layer 130 in areas exposed by the gate etch mask 132. The first part of the gate etch operation may include one or more reactive ion etch (RIE) steps which direct fluorine ions at the hard mask layer 130. A portion of the gate etch mask 132 may be removed during the first part of the gate etch operation, as depicted in FIG. 1D.

Figure 1E:
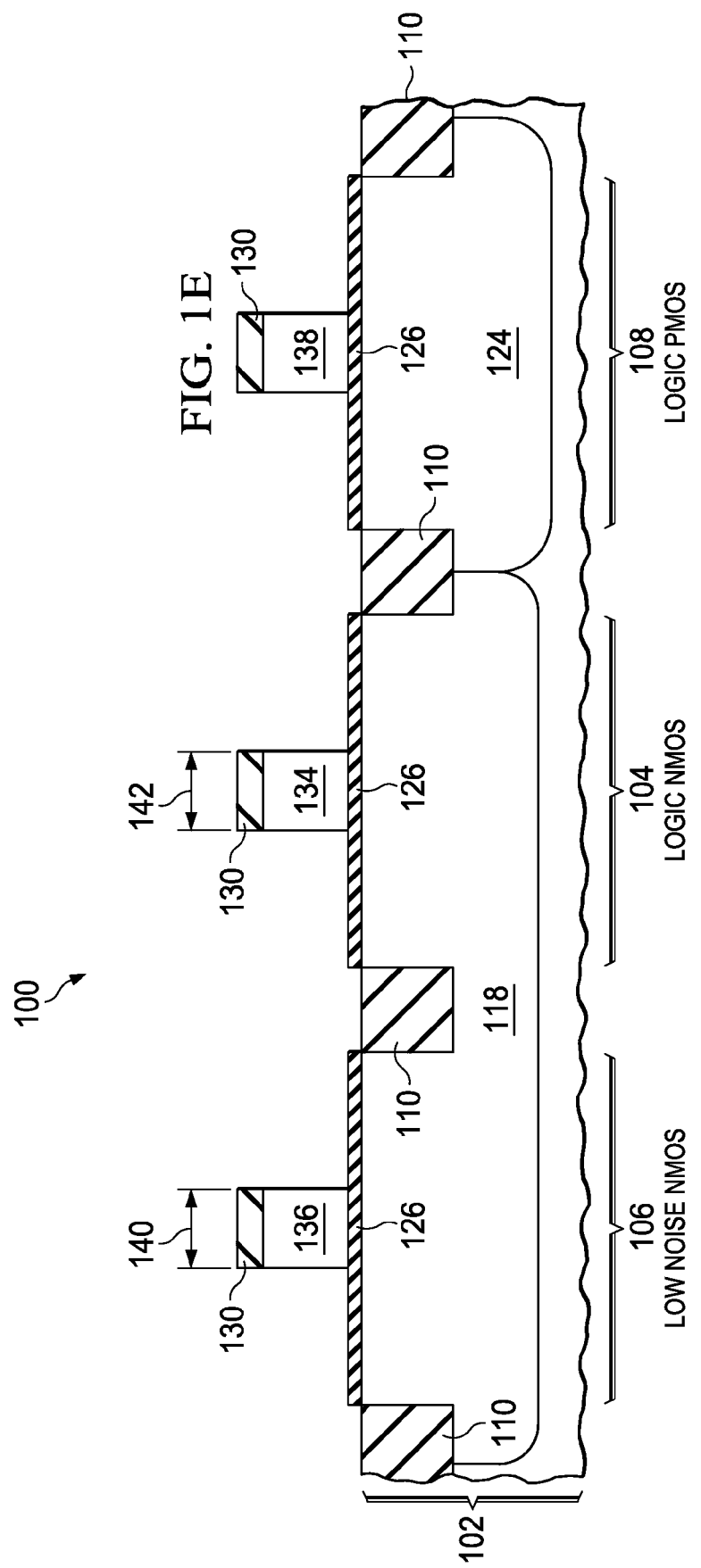

Referring to FIG. 1E, a second part of the gate etch process is performed which removes the gate material layer 128 of FIG. 1C and FIG. 1D in areas exposed by the etched hard mask layer 130, to form a logic NMOS gate 134, a low-noise NMOS gate 136 and a logic PMOS gate 138 in the areas defined for the logic NMOS transistor 104, the low-noise NMOS transistor 106 and the logic PMOS transistor 108, respectively. The gate etch mask 132 may be completely removed by the second part of the gate etch process. The hard mask layer 130 may be removed after the gate etch process is completed.

In alternate versions of the instant embodiment, an additional gate etch mask may be formed which defines ends of desired gate patterns over the field oxide 110, and the gate etch process may include one etch step to define edges of the gates in the areas defined for the logic NMOS transistor 104, the low-noise NMOS transistor 106 and the logic PMOS transistor 108, and a second etch step to define ends of the gates over the field oxide 110. Such a process sequence may be used in technology nodes, for example the 20 nanometer node, which have gate pitches significantly less than isotropic resolutions of photolithography equipment used to fabricate devices in the technology nodes.

The low-noise NMOS gate 136 is formed concurrently with the logic NMOS gate 134. A minimum gate linewidth 140 of instances of the low-noise NMOS gate 136 is less than four times a minimum gate linewidth 142 of instances of the logic NMOS gate 134. For example, in integrated circuit fabricated in the 65 nanometer technology node, the minimum gate linewidth 142 of logic NMOS transistors may be 42 nanometers, so that a minimum gate linewidth 140 of low-noise transistors formed in these integrated circuits according to the instant embodiment would be less than 168 nanometers. In some versions of the instant embodiment, the minimum gate linewidth 140 of instances of the low-noise NMOS gate 136 may less than two times the minimum gate linewidth 142 of instances of the logic NMOS transistor 104. In other versions of the instant embodiment, the minimum gate linewidth 140 of instances of the low-noise NMOS gate 136 may be substantially equal to the minimum gate linewidth 142 of instances of the logic NMOS transistor 104. In some versions of the instant embodiment, the minimum gate linewidth 142 of logic NMOS transistors may be less than 45 nanometers.

Referring to FIG. 1F, offset spacers 144 may be formed on lateral surfaces of the logic NMOS gate 134, the low-noise NMOS gate 136 and the logic PMOS gate 138. The offset spacers 144 may be one or more layers of silicon dioxide and/or silicon nitride, 1 to 10 nanometers thick. The offset spacers 144 on the logic PMOS gate 138 may have a different composition and thickness than the offset spacers 144 on the logic NMOS gate 134 and the low-noise NMOS gate 136. The offset spacers 144 may be formed by growing or depositing one or more conformal layers of dielectric on the gates 134, 136 and 138, and subsequently performing an anisotropic etch which removes at least a portion of the conformal layers on top surfaces of the gates 134, 136 and 138, leaving the offset spacers 144 on the lateral surfaces of the gates 134, 136 and 138.

Figure 1G:
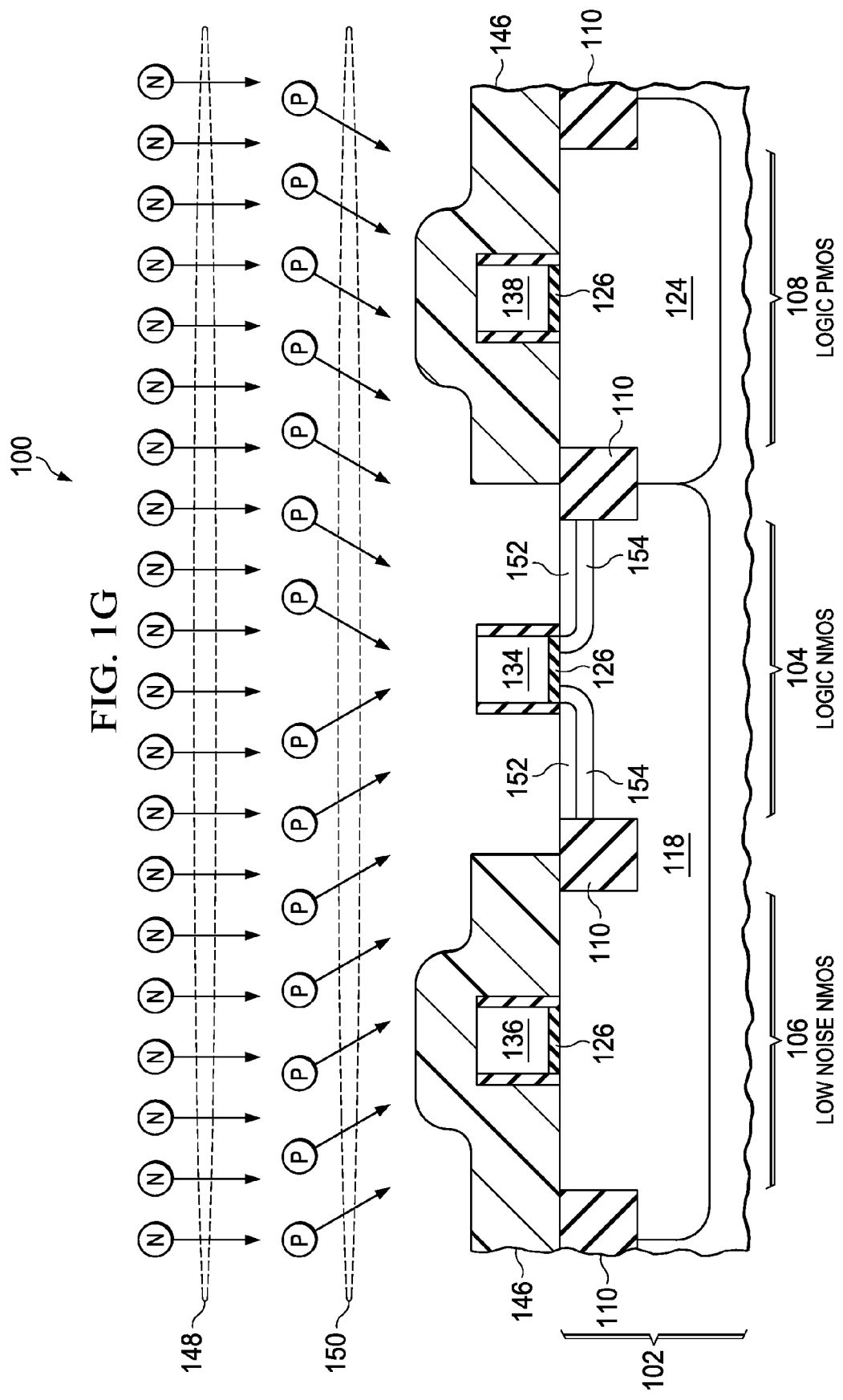

Referring to FIG. 1G, a logic NMOS NMDD implant mask 146 is formed over an existing top surface of the integrated circuit 100 so as to expose the logic NMOS 104 area and cover the low-noise NMOS 106 and logic PMOS 108 areas. The logic NMOS NMDD implant mask 146 may include, for example, 150 to 300 nanometers of photoresist and be formed by a photolithographic process. A logic NMOS NMDD ion implant operation 148 is performed which implants n-type dopants such as phosphorus and arsenic and possibly antimony at a dose of $5 \times 10^{13}$ cm$^{-2}$ to $1 \times 10^{15}$ cm$^{-2}$ and an energy less than 5 keV at a tilt angle less the 5 degrees into the substrate 102 adjacent to the logic NMOS gate 134. A logic NMOS halo ion implant operation 150 is performed which implants p-type dopants such as boron, gallium and/or indium, at a dose of at least $5 \times 10^{12}$ cm$^{-2}$ and an energy of 5 keV to 15 keV (for boron) or 20 keV to 40 keV (for indium) at a tilt angle of 15 to 30 degrees into the substrate 102 adjacent to the logic NMOS gate 134. Other implant processes may be performed while the logic NMOS NMDD implant mask 146 is in place to implant other species such as carbon to enhance performance of the logic NMOS transistor 104. No fluorine is implanted into the logic NMOS transistor 104 while the logic NMOS NMDD implant mask 146 is in place. The logic NMOS NMDD implant mask 146 is removed after the logic NMOS NMDD ion implant operation 148 and the logic NMOS halo ion implant operation 150 are completed. Subsequently, an anneal operation is performed which diffuses and activates the n-type dopants implanted by the logic NMOS NMDD ion implant operation 148 to form n-type logic NMOS NMDD regions 152 in the substrate 102 adjacent to, and partially underlapping, the logic NMOS gate 134. The anneal operation also diffuses and activates the p-type dopants implanted by the logic NMOS halo ion implant operation 150 to form p-type logic NMOS halo regions 154 in the substrate 102 adjacent to, and partially underlapping, the logic NMOS gate 134. The anneal operation may include, for example, a spike anneal step, a flash anneal step or a laser anneal step, which heats the top surface of the substrate 102 to 1180° C. for 500 microseconds or equivalent anneal conditions, for example, 1200° C. for 300 microseconds, or 110° C. for 3 milliseconds.

Figure 1H:
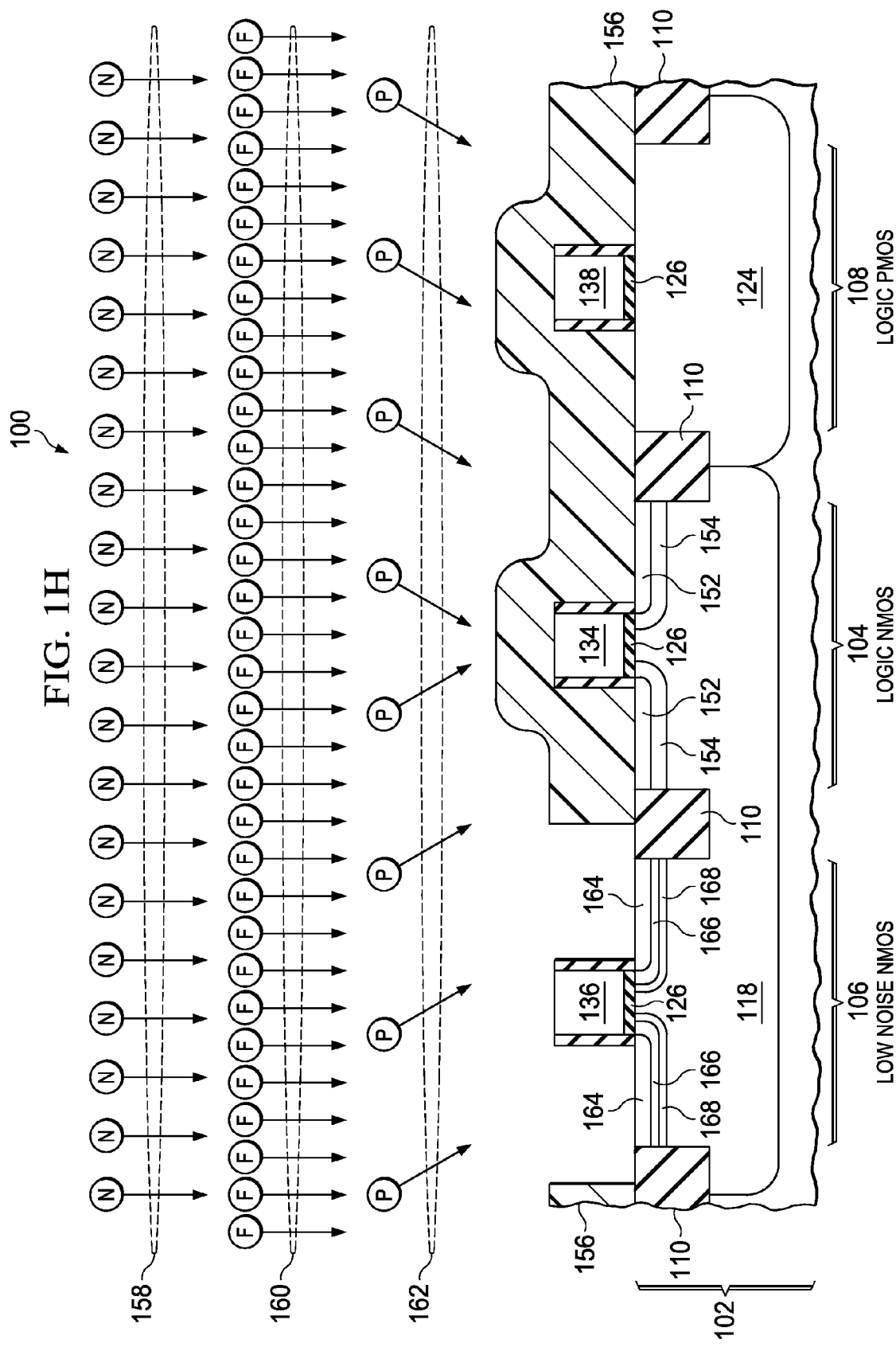

Referring to FIG. 1H, a low-noise NMOS NMDD implant mask 156 is formed over an existing top surface of the integrated circuit 100 so as to expose the low-noise NMOS 106 area and cover the logic NMOS 104 and logic PMOS 108 areas. The low-noise NMOS NMDD implant mask 156 may be formed by a similar process used for the logic NMOS NMDD implant mask 146 of FIG. 1G. A low-noise NMOS NMDD ion implant operation 158 is performed which implants n-type dopants such as phosphorus and arsenic and possibly antimony at a dose of $1 \times 10^{13}$ cm$^{-2}$ to $1 \times 10^{15}$ cm$^{-2}$ and an energy less than 5 keV at a tilt angle less the 5 degrees into the substrate 102 adjacent to the low-noise NMOS gate 136. A low-noise NMOS fluorine ion implant operation 160 is performed which implants fluorine at a dose of at least $1 \times 10^{14}$ cm$^{-2}$ and an exemplary energy of 10 keV to 20 keV into the substrate 102 adjacent to the low-noise NMOS gate 136. A total dose of the n-type dopants in the low-noise NMOS NMDD ion implant operation 158 may be 50 percent to 75 percent of a total dose of n-type dopants in the logic NMOS NMDD ion implant operation 148 of FIG. 1G, in order to desirably reduce a subthreshold current of the low-noise NMOS transistor 106. In one version of the instant embodiment, an optional low-noise NMOS halo ion implant operation 162 may be performed which implants p-type dopants, at a total dose less than 20 percent of the logic NMOS halo ion implant operation 150, at a tilt angle of 15 to 30 degrees into the substrate 102 adjacent to the low-noise NMOS gate 136. In an alternate version, no p-type dopants, that is, no boron, gallium or indium species, are implanted into the low-noise NMOS transistor 106 while the low-noise NMOS NMDD implant mask 156 is in place. Other implant processes may be performed while the low-noise NMOS NMDD implant mask 156 is in place as described in reference to FIG. 1G. The low-noise NMOS NMDD implant mask 156 is removed after the low-noise NMOS NMDD ion implant operation 158 and the low-noise NMOS fluorine ion implant operation 160 are completed. Subsequently, an anneal operation is performed which diffuses and activates the n-type dopants implanted by the low-noise NMOS NMDD ion implant operation 158 to form n-type low-noise NMOS NMDD regions 164 in the substrate 102 adjacent to, and partially underlapping, the low-noise NMOS gate 136. The anneal operation also diffuses the fluorine implanted by the low-noise NMOS fluorine ion implant operation 160 to form low-noise NMOS fluorine-doped regions 166 having at least $1 \times 10^{14}$ fluorine atoms per cm$^2$ in the substrate 102 adjacent to, and partially underlapping, the low-noise NMOS gate 136. In some versions of the instant embodiment, the fluorine dose of the low-noise NMOS fluorine ion implant operation 160 may be at least $1 \times 10^{15}$ cm$^{-2}$, so that the low-noise NMOS fluorine-doped regions 166 have at least $1 \times 10^{14}$ fluorine atoms per cm$^2$ in the substrate 102. If the low-noise halo ion implant operation 162 was performed, the anneal operation also diffuses and activates the p-type dopants implanted by the low-noise NMOS halo ion implant operation 162 to form p-type low-noise NMOS halo regions 168 in the substrate 102 adjacent to, and partially underlapping, the low-noise NMOS gate 136. The anneal operation may be similar to the logic NMOS MDD anneal described in reference to FIG. 1G and may be performed concurrently with the logic NMOS MDD anneal.

Figure 1I:
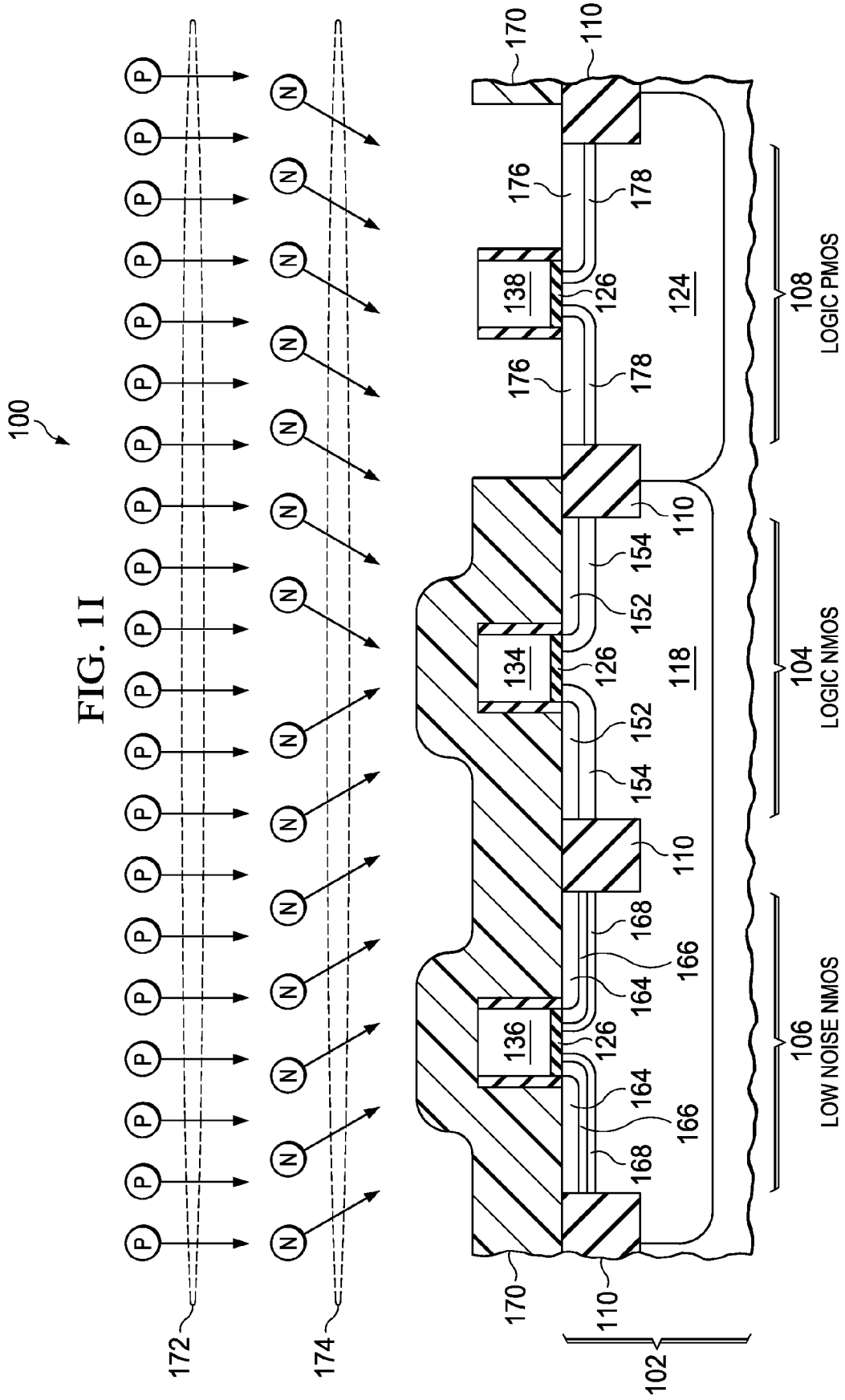

Referring to FIG. 1I, a logic PMOS p-channel medium doped drain (PMDD) implant mask 170 is formed over an existing top surface of the integrated circuit 100 so as to expose the logic PMOS 108 area and cover the logic NMOS 104 and low-noise NMOS 106 areas. The logic PMOS PMDD implant mask 170 may be formed by a similar process used for the logic NMOS NMDD implant mask 146 of FIG. 1G. A logic PMOS PMDD ion implant operation 172 is performed which implants p-type dopants such as boron, gallium and/or indium at a dose of $5 \times 10^{14}$ cm$^{-2}$ to $1 \times 10^{16}$ cm$^{-2}$ and an energy less than 5 keV at a tilt angle less the 5 degrees into the substrate 102 adjacent to the logic PMOS gate 138. A logic PMOS halo ion implant operation 174 is performed which implants n-type dopants such as phosphorus or arsenic, at a dose of at least $1 \times 10^{13}$ cm$^{-2}$ and an energy of 15 keV to 30 keV at a tilt angle of 15 to 30 degrees into the substrate 102 adjacent to the logic PMOS gate 138. Other implant processes may be performed while the logic PMOS PMDD implant mask 170 is in place to implant other species such as carbon and/or nitrogen to enhance performance of the logic PMOS transistor 108. The logic PMOS PMDD implant mask 170 is removed after the logic PMOS PMDD ion implant operation 172 and the logic PMOS halo ion implant operation 174 are completed. Subsequently, an anneal operation is performed which diffuses and activates the p-type dopants implanted by the logic PMOS PMDD ion implant operation 172 to form p-type logic PMOS PMDD regions 176 in the substrate adjacent to, and partially underlapping, the logic PMOS gate 138. The anneal operation also diffuses and activates the n-type dopants implanted by the logic PMOS halo ion implant operation 174 to form n-type logic PMOS halo regions 178 in the substrate adjacent to, and partially underlapping, the logic PMOS gate 138. The anneal operation may be similar to the logic NMOS MDD anneal described in reference to FIG. 1G and may be performed concurrently with the logic NMOS MDD anneal.

Figure 1J:
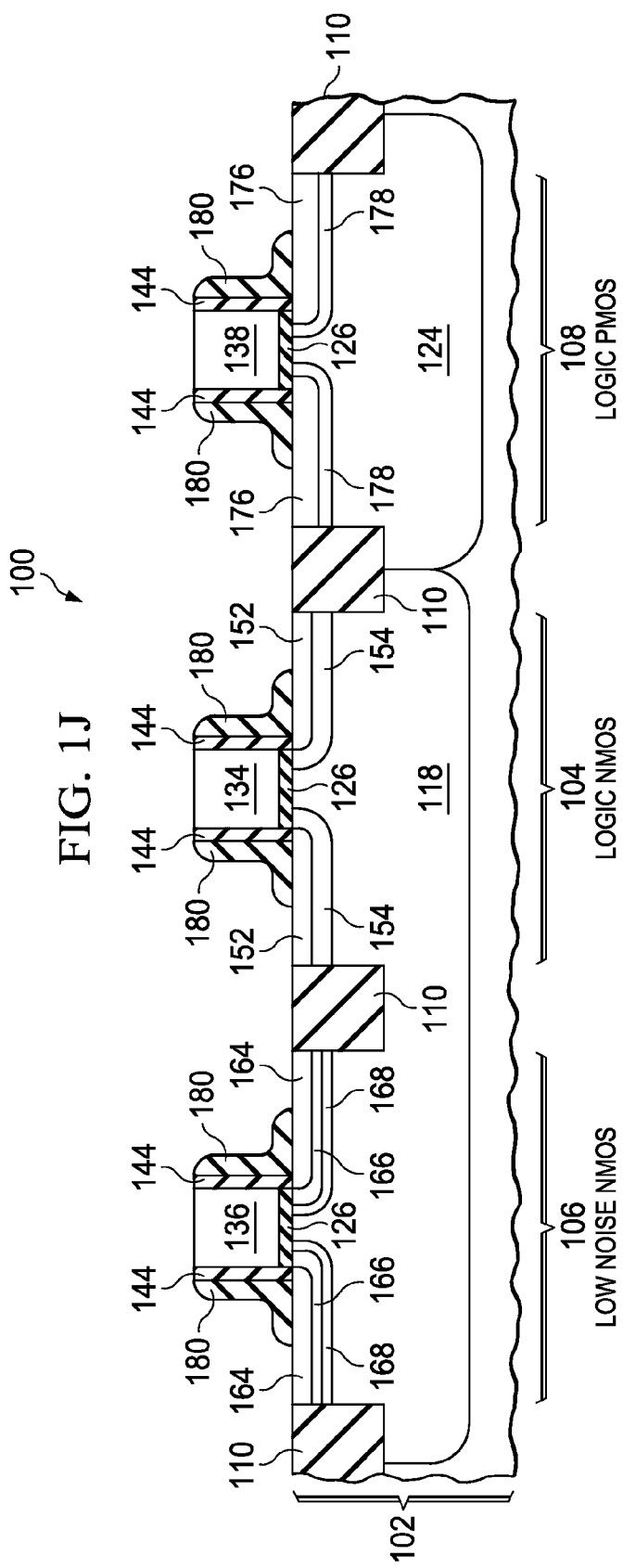

Referring to FIG. 1J, gate sidewall spacers 180 are formed abutting the offset spacers 144 on the logic NMOS gate 134, the low-noise NMOS gate 136 and the logic PMOS gate 138. The gate sidewall spacers 180 may be formed, for example, by deposition of one or more conformal layers of silicon nitride and/or silicon dioxide on a top and lateral surfaces of the logic NMOS gate 134, the low-noise NMOS gate 136 and the logic PMOS gate 138 and the offset spacers 144, and the top surface of the substrate 102, followed by removal of the conformal layer material from the top surface of the logic NMOS gate 134, the low-noise NMOS gate 136 and the logic PMOS gate 138 and the top surface of the substrate 102 by anisotropic etching methods such as RIE using fluorine, leaving the conformal layer material abutting the offset spacers 144.

Referring to FIG. 1K, an n-channel source/drain (NSD) implant mask 182 is formed over an existing top surface of the integrated circuit 100 so as to expose the logic NMOS 104 area and the low-noise NMOS 106 and cover the logic PMOS 108 areas. The NSD implant mask 182 may include, for example, 150 to 300 nanometers of photoresist and be formed by a photolithographic process. An NSD ion implant operation 184 is performed which implants n-type dopants such as phosphorus and arsenic and possibly antimony, possibly in several steps, at a total dose of $1 \times 10^{15}$ cm$^{-2}$ to $2 \times 10^{16}$ cm$^{-2}$ and an energy up to 50 keV into the substrate 102 adjacent to the gate sidewall spacers 180 at the logic NMOS gate 134 and the low-noise NMOS gate 136. Other implant processes may be performed while the NSD implant mask 182 is in place to implant other species such as carbon to enhance performance of the logic NMOS transistor 104 and the low-noise NMOS transistor 106. The NSD implant mask 182 is removed after the NSD ion implant operation 184 is completed. Subsequently, an anneal operation is performed which diffuses and activates the n-type dopants implanted by the NSD ion implant operation 184 to form n-type logic NMOS NSD regions 186 in the substrate adjacent to the logic NMOS gate 134 and to concurrently form n-type low-noise NMOS NSD regions 188 in the substrate adjacent to the low-noise NMOS gate 136. The anneal operation may include, for example, a spike anneal step, a flash anneal step or a laser anneal step.

Referring to FIG. 1L, a p-channel source/drain (PSD) implant mask 190 is formed over an existing top surface of the integrated circuit 100 so as to expose the logic PMOS 108 area and cover the logic NMOS 104 and the low-noise NMOS 106 areas. The PSD implant mask 190 may be formed by a similar process used for the NSD implant mask 182 of FIG. 1K. A PSD ion implant operation 192 is performed which implants p-type dopants such as boron and possibly gallium and/or indium, possibly in several steps, at a total dose of $3 \times 10^{15}$ cm$^{-2}$ to $3 \times 10^{16}$ cm$^{-2}$ and an energy up to 20 keV into the substrate 102 adjacent to the gate sidewall spacers 180 at the logic PMOS gate 138. Other implant processes may be performed while the PSD implant mask 190 is in place to implant other species such as carbon to enhance performance of the logic PMOS transistor 108. The PSD implant mask 190 is removed after the PSD ion implant operation 192 is completed. Subsequently, an anneal operation is performed which diffuses and activates the p-type dopants implanted by the PSD ion implant operation 192 to form p-type logic PMOS PSD regions 194 in the substrate adjacent to the logic PMOS gate 138. The anneal operation may be similar to the NSD anneal described in reference to FIG. 1K and may be performed concurrently with the NSD anneal.

Figure 1M:
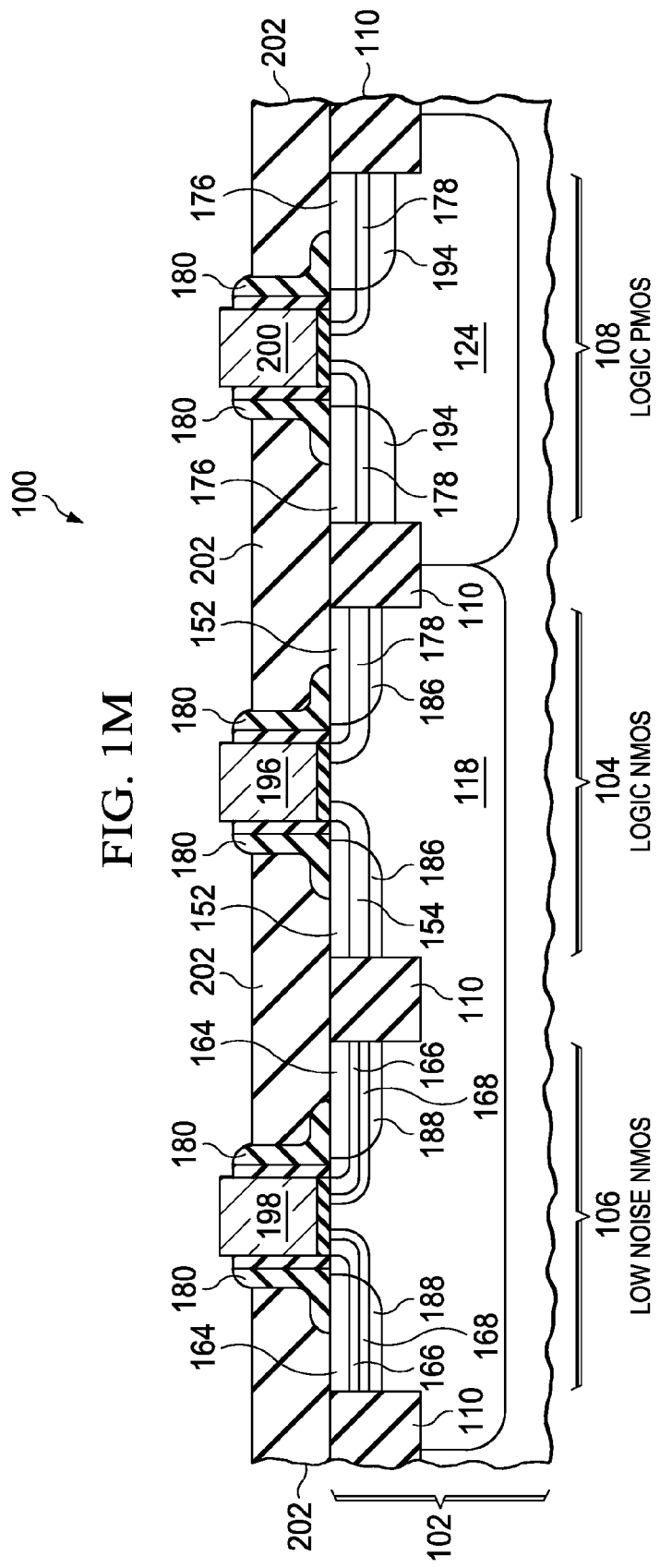

Referring to FIG. 1M, gate material in the logic NMOS gate 134, the low-noise NMOS gate 136 and the logic PMOS gate 138 of FIG. 1L may be replaced with alternate gate material, such as metal silicide, in a fully silicided process, or one or more metal layers, in a metal gate replacement process, to form replacement gates: logic NMOS replacement gate 196, low-noise NMOS replacement gate 198 and logic PMOS replacement gate 200, respectively. The replacement gate process may include, for example, forming a sacrificial dielectric layer 202 over the substrate 102 which exposes tops surfaces of the gate material in the logic NMOS gate 134, the low-noise NMOS gate 136 and the logic PMOS gate 138 of FIG. 1L, and subsequently replacing the gate material with metal silicide or one or more metal layers. The logic NMOS NSD regions 186 and the low-noise NSD regions 188 may be formed of a semiconductor material, such as silicon carbide, different from a starting material of the substrate 102.

During fabrication of the integrated circuit 100, every photoresist pattern, other than the logic NMOS NMDD implant mask 146 of FIG. 1G, which exposes the logic NMOS 104 area also exposes the low-noise NMOS 106 area, such as the NSD implant mask 182 of FIG. 1K. Every photoresist pattern, other than the low-noise NMOS NMDD implant mask 156 of FIG. 1H, which exposes the low-noise NMOS 106 area also exposes the logic NMOS 104 area, such as the NSD implant mask 182 of FIG. 1K. Every photoresist pattern, other than the low-noise NMOS NMDD implant mask 156 of FIG. 1H, which covers the logic NMOS 104 area also covers the low-noise NMOS 106 area, such as the PSD implant mask 190 of FIG. 1L. Every photoresist pattern, other than the logic NMOS NMDD implant mask 146 of FIG. 1G, which covers the low-noise NMOS 106 area also covers the logic NMOS 104 area, such as the PSD implant mask 190 of FIG. 1L. Thus, fabrication of the integrated circuit 100 according to the instant embodiment requires exactly one extra photoresist pattern compared to a similar integrated circuit which forms the logic NMOS transistor 104 and the low-noise NMOS transistor 106 with identical steps.

Forming low-noise NMOS transistors with fluorine implants and reduced or no halo implants may provide a desired reduction in noise power. Experiments performed in conjunction with this disclosure have demonstrated low-noise NMOS transistors formed according to the process described in reference to FIG. 1A through FIG. 1L which exhibit noise power reduction that is a factor of two less than combined noise power reduction of equally sized NMOS transistors having only fluorine implants and equally sized NMOS transistors with no halo implants.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process for forming an integrated circuit, comprising:
providing a semiconductor substrate, said substrate including an area defined for a logic NMOS (n-channel metal oxide semiconductor) transistor, an area defined for a low-noise NMOS transistor and an area defined for a logic PMOS (p-channel metal oxide semiconductor) transistor;
forming a gate dielectric layer disposed at a top surface of said substrate in said low-noise NMOS area and in said logic NMOS area;
forming a logic NMOS gate over said gate dielectric layer in said logic NMOS area;
forming a low-noise NMOS gate over said gate dielectric layer in said low-noise NMOS area, so that a gate linewidth of said low-noise NMOS gate is less than four times a gate linewidth of said logic NMOS gate;
forming n-type logic NMOS NMDD (n-channel medium doped drain) regions in said substrate adjacent to, and partially underlapping, said logic NMOS gate and p-type logic NMOS halo regions in said substrate adjacent to, and partially underlapping, said logic NMOS gate, wherein said logic NMOS NMDD regions are substantially free of fluorine; and
forming n-type low-noise NMOS NMDD regions in said substrate adjacent to, and partially underlapping, said low-noise NMOS gate and low-noise NMOS fluorine-doped regions having at least $1\times10^{14}$ fluorine atoms per cm$^2$ in said substrate adjacent to, and partially underlapping, said low-noise NMOS gate, wherein a total dose of p-type halo dopants in said low-noise NMOS NMDD regions is less than 20 percent of a total dose of p-type halo dopants in said logic NMOS halo regions.

2. The process of claim 1, in which no boron, gallium or indium species are implanted into said low-noise NMOS transistor area during said step of forming said n-type low-noise NMOS NMDD regions.

3. The process of claim 1, in which said step of forming said n-type low-noise NMOS NMDD regions is performed so that said low-noise NMOS fluorine-doped regions have at least $1\times10^{15}$ fluorine atoms per cm$^2$ in said substrate adjacent to, and partially underlapping, said low-noise NMOS gate.

4. The process of claim 1, in which said gate linewidth of said logic NMOS gate is less than 45 nanometers.

5. An integrated circuit, comprising:
a semiconductor substrate, said substrate including an area defined for a logic NMOS (n-channel metal oxide semiconductor) transistor, an area defined for a low-noise NMOS transistor and an area defined for a logic PMOS (p-channel metal oxide semiconductor) transistor;
a gate dielectric layer disposed at a top surface of said substrate in said low-noise NMOS area and in said logic NMOS area;
a logic NMOS gate over said gate dielectric layer in said logic NMOS area;
a low-noise NMOS gate over said gate dielectric layer in said low-noise NMOS area, so that a gate linewidth of said low-noise NMOS gate is less than four times a gate linewidth of said logic NMOS gate;
n-type logic NMOS NMDD (n-channel medium doped drain) regions in said substrate adjacent to, and partially underlapping, said logic NMOS gate and p-type logic NMOS halo regions in said substrate adjacent to, and partially underlapping, said logic NMOS gate, wherein said logic NMOS NMDD regions are substantially free of fluorine; and
n-type low-noise NMOS NMDD regions in said substrate adjacent to, and partially underlapping, said low-noise NMOS gate and low-noise NMOS fluorine-doped regions having at least $1\times10^{14}$ fluorine atoms per cm$^2$ in said substrate adjacent to, and partially underlapping, said low-noise NMOS gate, wherein a total dose of p-type halo dopants in said low-noise NMOS NMDD regions is less than 20 percent of a total dose of p-type halo dopants in said logic NMOS halo regions.

6. The integrated circuit of claim 5, in which said low-noise NMOS NMDD regions are substantially free of p-type halo dopants.

7. The integrated circuit of claim 5, in which said low-noise NMOS fluorine-doped regions have at least $1\times10^{15}$ fluorine atoms per cm$^2$ in said substrate.

8. The integrated circuit of claim 5, in which said gate linewidth of said logic NMOS gate is less than 45 nanometers.

9. The integrated circuit of claim 5, in which said gate linewidth of said low-noise NMOS gate is less than two times said gate linewidth of said logic NMOS gate.

10. The integrated circuit of claim 5, in which said gate linewidth of said low-noise NMOS gate is substantially equal to said gate linewidth of said logic NMOS gate.

11. The integrated circuit of claim 5, in which total amount of n-type dopants in said low-noise NMOS NMDD regions is 50 percent to 75 percent of a total amount of n-type dopants in said logic NMOS NMDD regions.

12. The integrated circuit of claim 5, in which said gate dielectric layer includes hafnium.

* * * * *